United States Patent
Ganci

(10) Patent No.: US 6,621,432 B1
(45) Date of Patent: Sep. 16, 2003

(54) DIGITAL TO DIFFERENTIAL CONVERTERS AND DIGITAL TO ANALOG CONVERTERS USING THE SAME

(75) Inventor: Paul Ronald Ganci, Golden, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/233,928

(22) Filed: Sep. 3, 2002

(51) Int. Cl.[7] .............................. H03M 1/00
(52) U.S. Cl. ...................... 341/136; 341/144
(58) Field of Search ................ 341/144, 136, 341/143, 135, 153

(56) References Cited

U.S. PATENT DOCUMENTS 5,815,103 A * 9/1998 Comminges et al. ....... 341/144

* cited by examiner

*Primary Examiner*—Peguy JeanPierre
*Assistant Examiner*—Joseph Lauture
(74) *Attorney, Agent, or Firm*—James J. Murphy, Esq.; Winstead Sechrest & Minnick, P.C.

(57) ABSTRACT

A converter for converting digital data into differential analog signals includes a temperature and process independent bias voltage generator for generating a bias voltage and a digital to differential converter for converting a digital word into differential voltages. The digital to differential converter includes a first switching circuitry controlled by the digital word for selectively coupling a first output node to the bias voltage and a second output node to a supply voltage. Second switching circuitry controlled by a complement of the digital word selectively couples the first output node to the supply voltage and the second output node to the bias voltage. The first and second pairs of switches substantially simultaneously conduct at a desired differential crossover voltage at the first and second output nodes based on the choice of the bias voltage such that the digital to differential analog converter operates from the operating voltage to the operating voltage plus the bias voltage range.

18 Claims, 7 Drawing Sheets

DIGITAL TO DIFFERENTIAL CONVERTERS AND DIGITAL TO ANALOG CONVERTERS USING THE SAME

BACKGROUND OF THE INVENTION

1. Field of Invention

The present invention relates in general to mixed digital-analog circuits and in particular to digital to differential converters and digital to analog converters using the same.

2. Background of Invention

Mixed signal circuit designs, generally integrating both analog and digital circuit blocks on the same integrated circuit chip, have proliferated over the last decade. A significant number of these designs, such as digital to analog converters (DACs), require the conversion of single-ended digital data into differential analog signals. Often these differential analog signals must be generated in the presence of an arbitrary capacitive load and variations in supply voltage, temperature, and process corner. Circuit operation under these conditions typically leads to distortion, spiking, and gain error in the resulting voltage or current output signals.

In the case of a typical high-speed current steering DAC, an analog output is generated by summing binary weighted currents switched by transistors controlled by the incoming digital codewords. As the slew rate of the logic signals increases as digital technology advances, the speed and accuracy of the switching transistors becomes more critical if distortion in the output signal is to be minimized. One way of addressing the problem of distortion is to generate differential analog signals from the single-ended digital data and then use the differential signals to drive a differential transistor pair (diffpair) in a relatively distortion-less manner. The diffpair circuits in turn are the basic building blocks of a current steering DAC, which switch the weighted currents.

Various techniques have therefore been developed for converting high-speed, single-ended logic levels to accurate, low distortion, differential analog signals. These techniques ensure that the output signals precisely track the input signal duty cycle and have substantially equal output rising and falling slew rates for the output signals. The existing techniques are still subject to significant output distortion, especially in high-speed circuits and/or in the presence of increased capacitive loads. In sum, new circuits and methods are required for converting digital logic levels into differential analog levels with minimal distortion. These new circuits and methods should be particularly useful in low-distortion digital to analog converters, although not necessarily limited thereto.

SUMMARY OF INVENTION

The principles of the present invention are embodied in digital to differential analog converter cells and multiple-bit digital to analog converters using the same. According to one particular embodiment, converter circuitry is disclosed for converting digital data into differential analog signals. The converter circuitry includes a temperature and process independent bias voltage generator for generating a bias voltage and a digital to differential converter for converting a digital word into differential voltages. The digital to differential converter includes first switching circuitry controlled by the digital word for selectively coupling a first output node to the bias voltage and a second output node to a supply voltage. Second switching circuitry controlled by a complement of the digital word selectively couples the first output node to the supply voltage and the second output node to the bias voltage. The first and second pairs of switches substantially simultaneously conduct at a differential crossover voltage at the first and second output nodes.

Application of the present inventive principles realize substantial advantages over the prior art. The digital to differential analog converter output switches provides the averaging effect that results in minimal distortion in the analog output signal. Furthermore, bias voltage and current circuitry that is temperature, process, and supply independent ensures that the gain variation of the current steering differential pair DAC cell is minimal. Also, the disclosed circuits are scalable such that varying loads, such as weighted current steering cells, are supported by a direct scaling of transistor sizes.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–6 of the drawings, in which like numbers designate like parts.

Figure 1A:
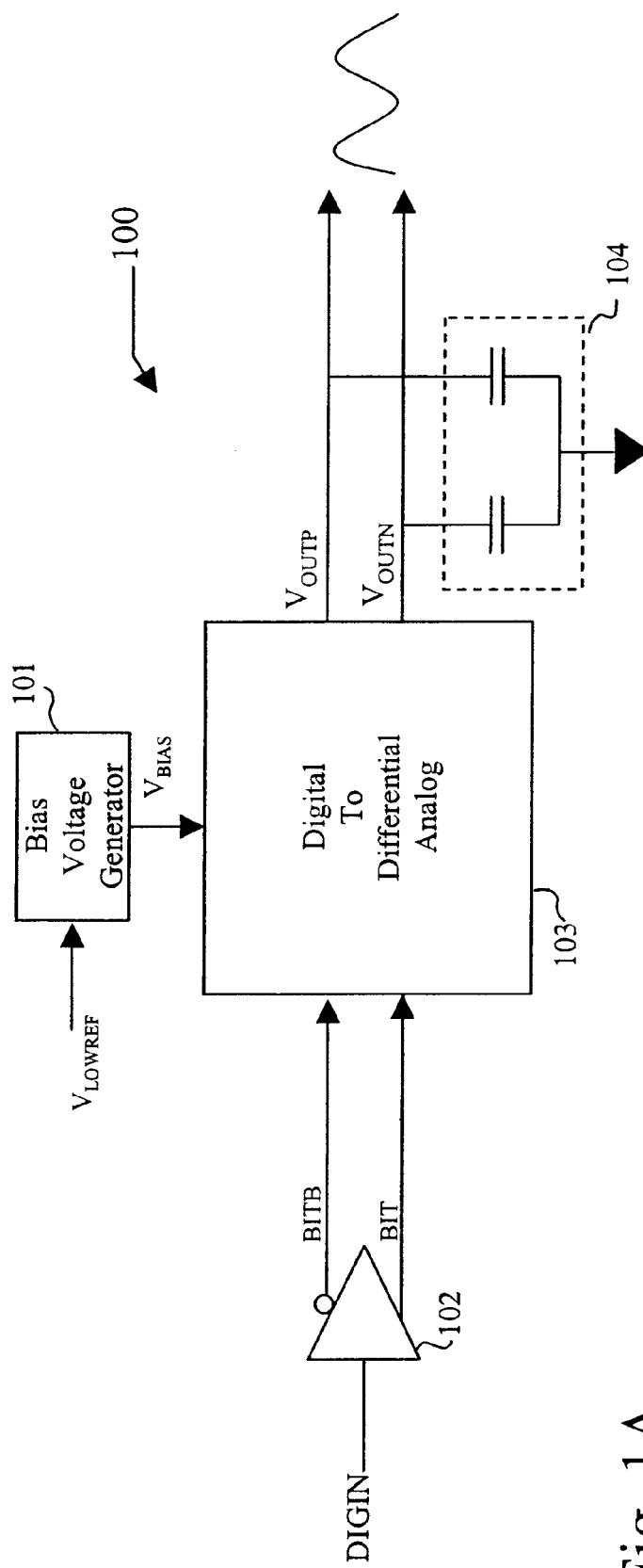
FIG. 1A is a high level operational block diagram of an exemplary digital to differential analog conversion circuitry embodying the inventive principles.

FIG. 1A is a high-level operational block diagram illustrating the primary circuit blocks of an exemplary Digital to Differential Analog Converter 100 embodying the inventive concepts. Each of the depicted blocks will be discussed in detail below. Generally, however, Bias Voltage Generator 101 generates a temperature and fabrication process independent bias voltage $V_{Bias}$ which tracks the digital supply rail and is used to drive the remaining circuitry in converter 100. (When a quantity is process, supply, or temperature independent, that quantity does not change in response to a change in process, supply, or temperature.) Digital to Complementary Converter 102 converts a single-ended digital bit stream DIGIN into complementary bit streams BIT and BITB, which in turn drive Digital to Differential Analog Converter 103. The capacitive output loading is shown generally at 104.

Figure 1B:
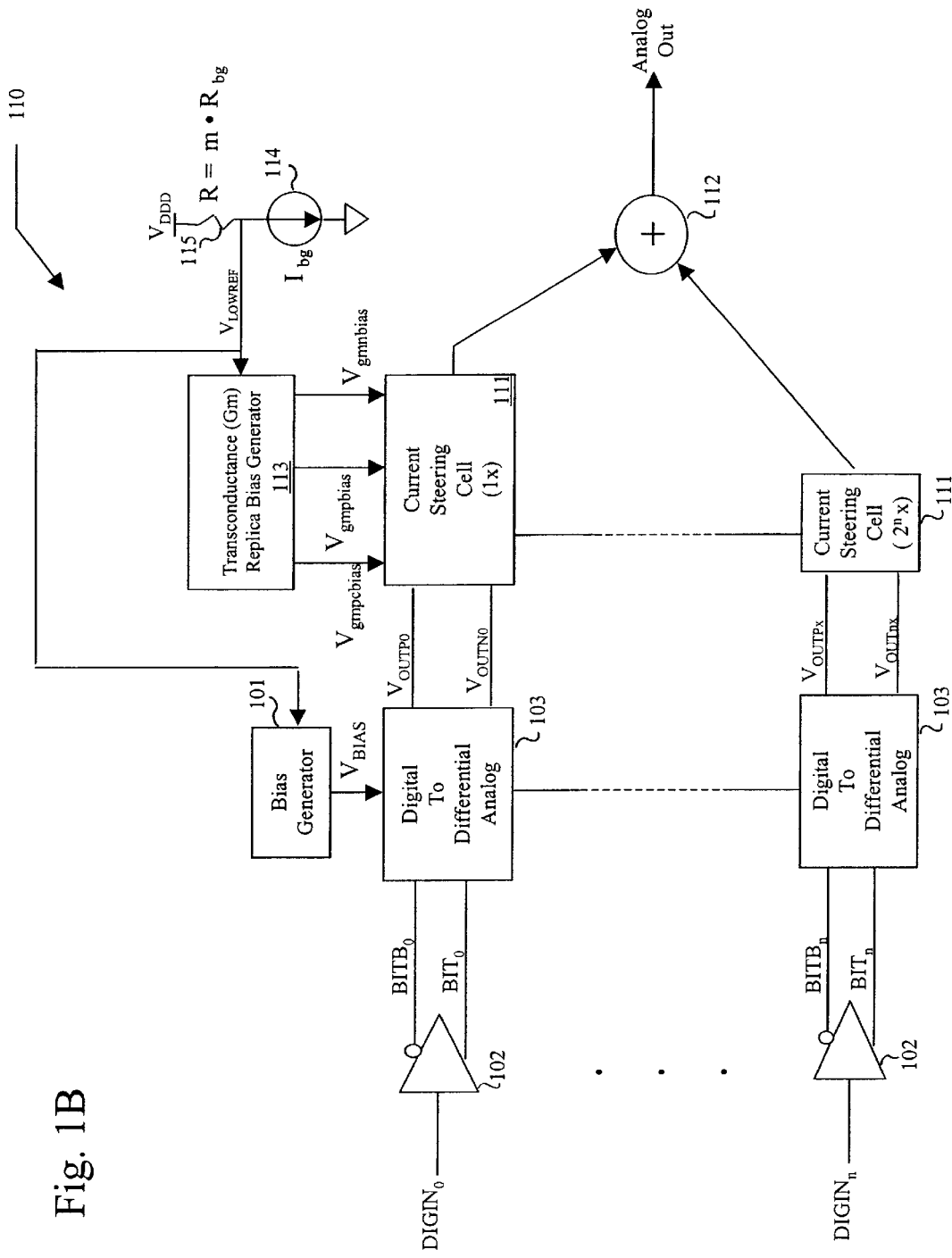
FIG. 1B is a high level operational block diagram of an exemplary low-distortion digital to analog converter (DAC) suitable for demonstrating the use of the digital to differential converter shown in FIG. 1A.

One use of Digital to Differential Analog Converter 100 is illustrated by the exemplary multiple-bit Digital to Analog Converter (DAC) 110 shown in FIG. 1B. In this example, n+1 bit wide digital codewords composed of bits $DIGIN_0$–$DIGIN_n$ are passed through a corresponding set of n+1 number of parallel Digital to Differential Analog Converters 103. Preferably, only one Bias Voltage Generator 101 supports all the blocks of DAC 110, although this configurations not a strict requirement of practicing the inventive concepts. The input codewords could be binary encoded words, thermometer encoded words, or a combination of binary and thermometer bits (e.g. binary encoded least significant bits and thermometer encoded most significant bits).

The resulting differential output signals $V_{OUTP}$ and $V_{OUTN}$ are utilized to drive the diffpair inputs to Current Steering Cells 111. The resulting weighted currents are summed by summer 112 to generate the final analog output, which is a differential or single-ended output. Current Steering Cells 111 are biased by voltages $V_{gmnbias}$, $V_{gmpbias}$ and $V_{gmpcbias}$ generated by the Transconductance (Gm) Replica Bias Generator 113 from a bandgap reference current which is process, supply, and temperature independent. Therefore the resulting transconductance Gm created by the Transconductance Replica Bias Generator 113 is also process, supply, and temperature independent, which allows for a current steering differential pair DAC cell 111 which exhibits very minimal gain error over process, supply, and temperature.

As will be discussed further below, both Bias Voltage Generator 101 and Transconductance Replica Bias Generator 113 operate from a reference voltage $V_{LOWREF}$. $V_{LOWREF}$ is created by using the bandgap reference cell current generator 114 to pull a current $I_{bg}$ from resistor R 115 which is referenced to the digital supply rail $V_{DDD}$. Consequently, the reference voltage $V_{LOWREF}$ is equal to the digital supply voltage $V_{DDD}$ less the voltage drop across resistor R 115:

$$V_{LOWREF}=V_{DDD}-(I_{bg} \cdot R) \tag{1}$$

The current $I_{bg}$ is related to the bandgap reference voltage $V_{bg}$ generated in the bandgap cell according to the relationship $I_{bg}=V_{bg}/R_{bg}$ where $R_{bg}$ is the bandgap reference resistor of reference cell 114. The bandgap reference voltage $V_{bg}$ is independent of process, supply and temperature whereas the bandgap reference resistor $R_{bg}$ is not. Therefore, while bandgap current $I_{bg}$ has a large process and temperature variation, the resulting reference voltage $V_{LOWREF}$ tracks the digital supply $V_{DDD}$ and will be process and temperature independent if R 115 is chosen to be some arbitrary, possibly fractional multiple of bandgap reference resistor $R_{bg}$. By selecting a value for resistor R 115, which is an arbitrary multiple of the bandgap resistor $R_{bg}$, an arbitrary reference voltage $V_{LOWREF}$ is generated, which is related to the digital supply voltage $V_{DDD}$ and the bandgap voltage $V_{bg}$ by a non-integer multiplicity constant m:

$$V_{LOWREF}=V_{DDD}-[V_{bg}/R_{bg} \cdot (m \cdot R_{bg})]=V_{DDD}-(m \, V_{bg}) \tag{2}$$

The voltage reference $V_{LOWREF}$ is therefore independent of process and temperature and preferably tracks the digital supply voltage $V_{DDD}$, although this requirement is not necessary to practice the inventive principles.

Figure 2:
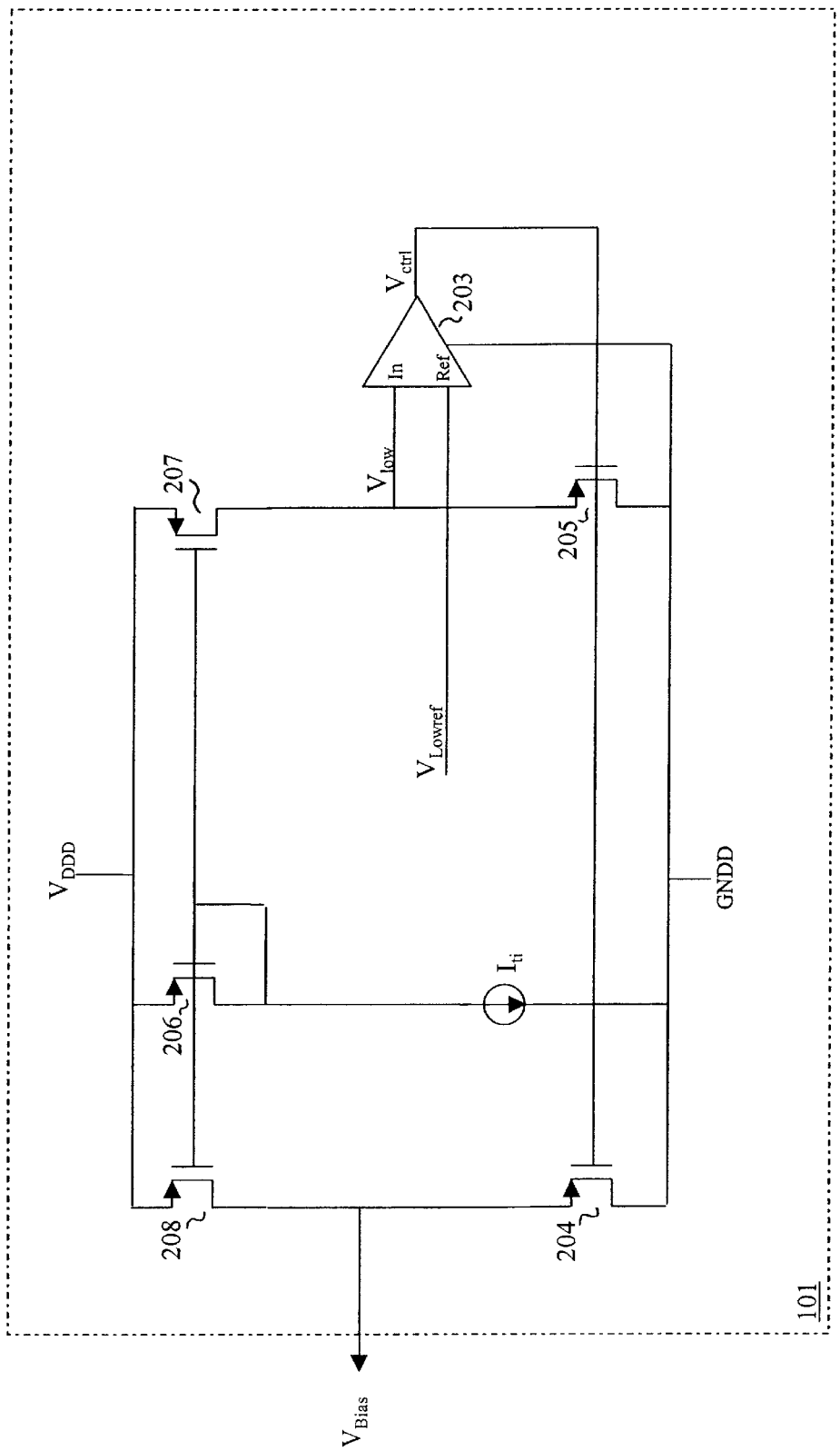
FIG. 2 is an electrical schematic diagram of the exemplary bias voltage generator shown in FIGS. 1A and 1B.

Bias Voltage Generator 101 is shown in further detail in the electrical schematic diagram of FIG. 2. The process and temperature independent reference voltage $V_{LOWREF}$ is utilized as the reference to high gain amplifier 203, which generates a control voltage $V_{CTRL}$ such that $V_{LOWREF}$ and the input voltage $V_{LOW}$ are substantially equalized ($V_{LOWREF}=V_{LOW}$). Specifically, the current mirror formed by transistors 206 and 207 produces a process, supply, and temperature independent current $I_{Ti}$ through PMOS source transistor 205 such that:

$$V_{LOW}=V_{CTRL}+V_{TP0}+\mathrm{sqrt}[2 \cdot I_{Ti}/K_p \cdot (W/L)_0] \tag{3}$$

where $K_p$, $(W/L)_0$, and $V_{TP0}$ are respectively the transconductance constant, the channel width to length (aspect) ratio, and the threshold voltage for PMOS transistor 205.

Amplifier 203 forces the voltage $V_{Ctrl}$ to the value:

$$V_{CTRL}=A_v \cdot (V_{LOW}-V_{LOWREFF}) \tag{4}$$

in which $A_v$ is the gain of amplifier 203.

Equations (3) and (4) yield the following:

$$V_{LOW}=(A_v \cdot V_{LOWREF}-V_{TP0}-\mathrm{sqrt}[2I_{Ti}/(K_p \cdot (W/L)_0)])/(A_v-1); \tag{5}$$

and $$V_{CTRL}=(A_v/(A_v-1)) \cdot (V_{LOWREF}-V_{TP0}-\mathrm{sqrt}[2 \cdot I_{Ti}/(K_p \cdot (W/L)_0)]) \tag{6}$$

Equations (5) and (6) respectively become in the limit $A_v \gg 1$ to:

$$V_{LOW}=V_{LOWREF}; \text{ and} \tag{7}$$

$$V_{CTRL}=V_{LOWREF}-V_{TP0}-\mathrm{sqrt}[2 \cdot I_{Ti}/(K_p \cdot (W/L)_0)] \tag{8}$$

Consequently, the voltage reference $V_{LOW}$ is effectively temperature and process independent and tracks the digital supply rail $V_{DDD}$.

Transistors 204 and 208 form a replica biased source follower, having an output voltage $V_{BIAS}=V_{LOW}$ which drives one end of digital to differential analog converter 103. This replica-biasing scheme has at least two significant advantages. First, the loop generating the voltage $V_{LOW}$ remains undisturbed during high-speed operation of converter block 103 leaving the $V_{LOWREF}$ voltage undisturbed. Second, a replica biased source follower provides an appropriately sized buffer to drive the following PMOS switches of block 103 (described below) as a function of the size of these switches as well as the load being driven by converter 103.

Figure 3:
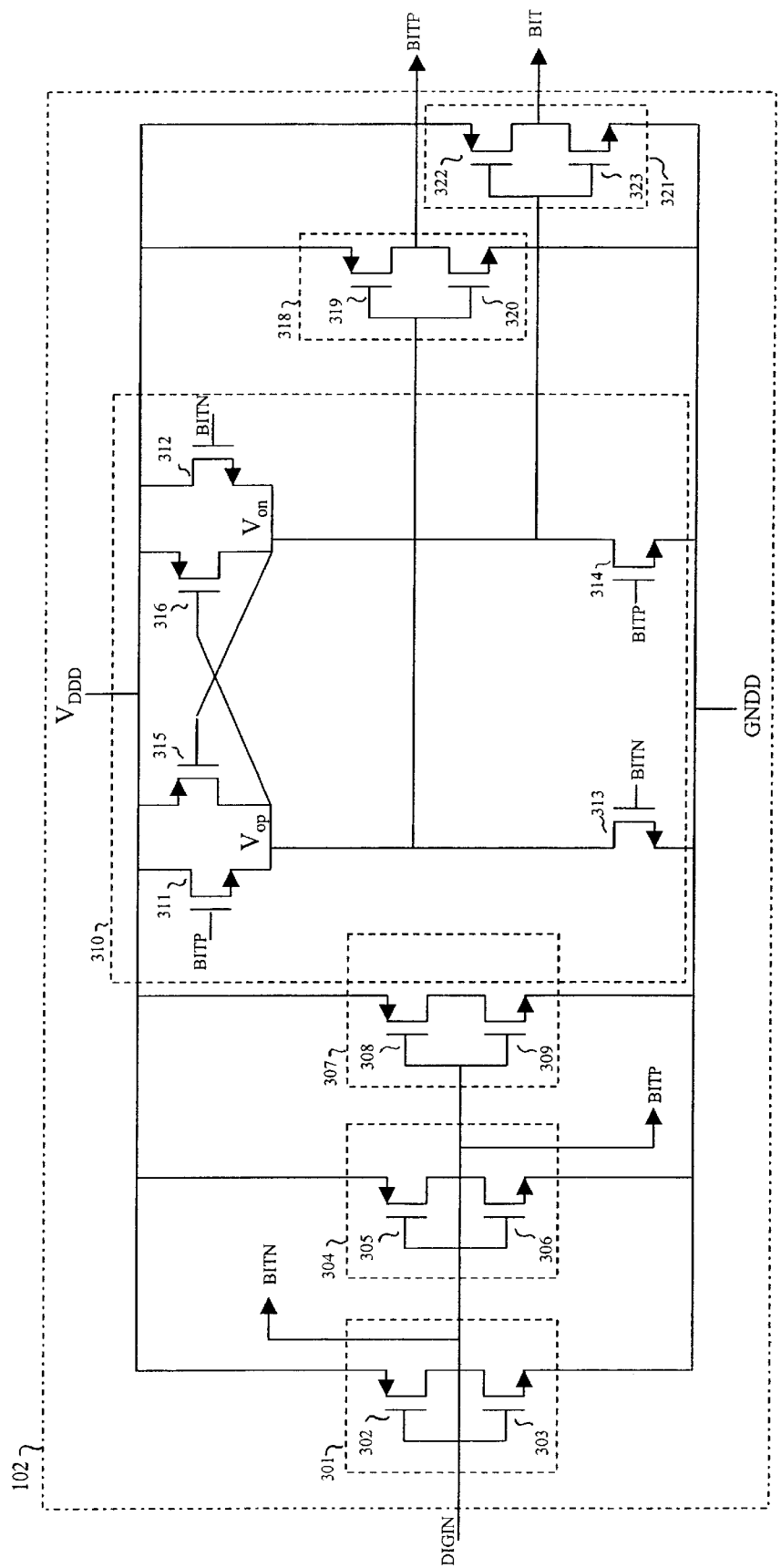
FIG. 3 is an electrical schematic diagram of the exemplary single-ended digital to complementary digital converters shown in FIGS. 1A and 1B.

FIG. 3 is an electrical schematic diagram of exemplary single-ended digital to complementary Digital Converter (SD/CD) Converter Block 102 as shown in FIGS. 1A and 1B. The single-ended digital input signal DIGIN is passed through a pair of series-coupled inverters 301 and 304. Inverter 301 is formed by PMOS transistor 302 and NMOS transistor 303, and inverter 304 is formed by PMOS transistor 305 and NMOS transistor 306. Inverters 301 and 304 respectively generate complementary digital signals BITN and BITP. A dummy inverter 307, having PMOS transistor 308 and NMOS transistor 309, balances the loads to Complementary Pass Transistor Logic (CPTL) inverter gate 310.

CPTL 310 includes four NMOS transistors 311–314. A pair of weak regeneration PMOS transistors 315, 316 pulls node (intermediate) voltages $V_{op}$ and $V_{on}$ all the way to the supply rail $V_{DDD}$ on transitions of BITP and BITN from their logic low to logic high states. Inverter 318 (PMOS transistor 319 and NMOS transistor 320) generates the output bit BITB and inverter 321 (PMOS transistor 322 and NMOS transistor 323) generates the complement BIT. The symmetry of inverters 318 and 321 generate complementary outputs BITB and BIT, which have crossing voltage values that occur approximately at one-half the supply voltage rail, $V_{DDD}/2$.

Figure 4:
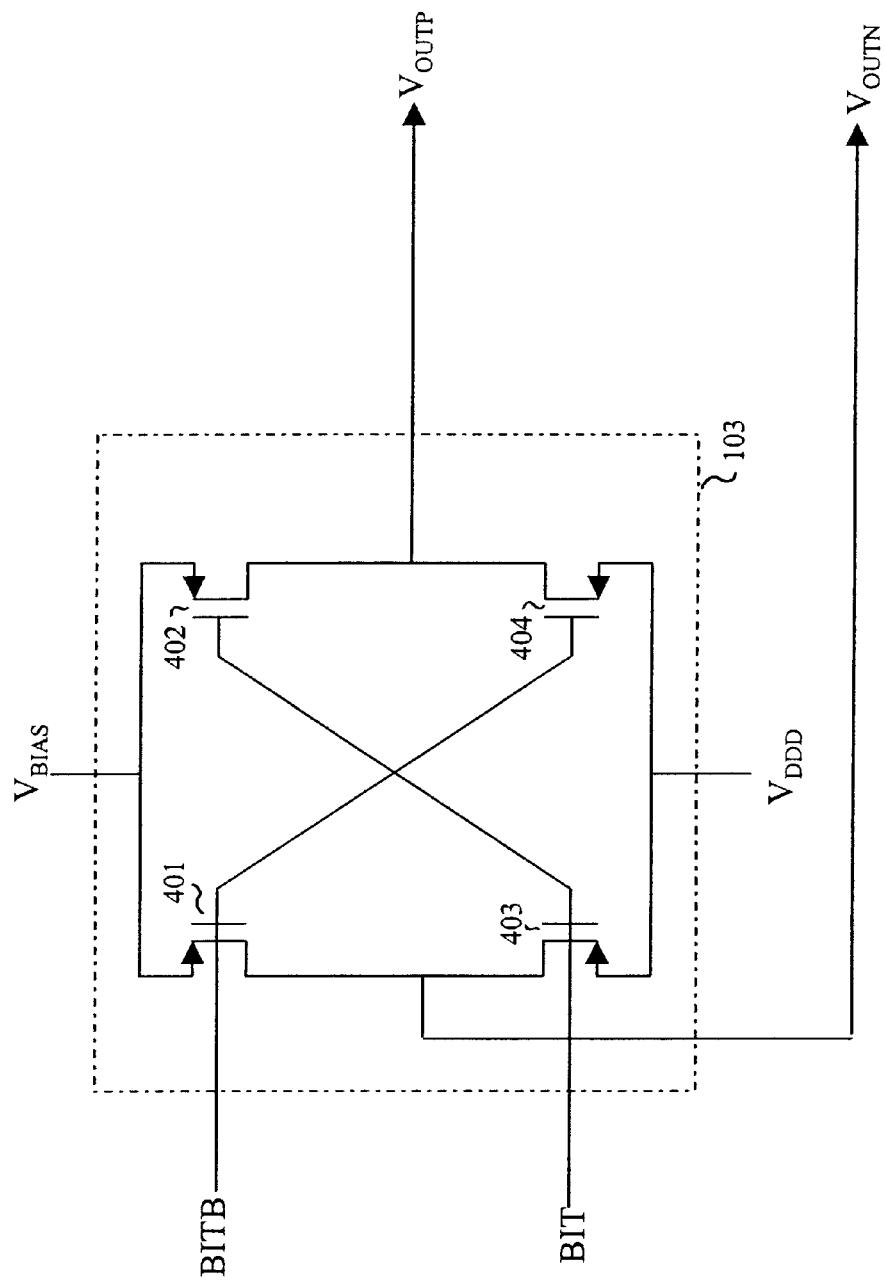
FIG. 4 is an electrical schematic diagram of the exemplary complementary digital to differential analog converter of FIGS. 1A and 1B.

An electrical schematic diagram of exemplary Complementary Digital to Differential Analog Converter (CD/DA) 103 (as shown in FIGS. 1A and 1B) is illustrated in FIG. 4. Converter 103 has four PMOS transistors 401–404, and operates as follows.

When input BIT from SD/CD converter block 102 approaches the supply rail $V_{DDD}$ and its complement BITB approaches the ground rail GNDD, transistors (switches) 402 and 403 turn-off (open) and transistors 401 and 404 turn-on (close). Consequently, the output $V_{OUTP}$ is pulled-up to $V_{DDD}$ and the output $V_{OUTN}$ is pulled-down to $V_{BIAS}$. Conversely, if BIT approaches GNDD and BITB approaches $V_{DDD}$, transistors (switches) 402 and 403 turn-on (close). Furthermore, transistors 401 and 404 turn-off (open), and output $V_{OUTP}$ is pulled-down to $V_{BIAS}$. Also, the output $V_{OUTN}$ is pulled-up to $V_{DDD}$.

The switch on resistance RON for switches 403, 404 and 401, 402 is given respectively, as:

$$R_{ON} = 1/[K_p \cdot (W/L) \cdot (V_{BIAS} - V_{Tp})]; \text{ and} \quad (9)$$

$$R_{ON} 1/[K_p \cdot (W/L) \cdot (V_{DDD} - V_{Tp})], \quad (10)$$

where (W/L) is the width to length ratio of transistors 401–404 and $V_{TP}$ is the associated threshold voltage. Since $V_{BIAS} < V_{DDD}$, the turn-on resistance $R_{ON}$ of transistors 401 and 402 will normally be greater than that of transistors 403 and 404. Therefore, the aspect ratio W/L for transistors 401, 402 is preferably selected to be slightly larger that the aspect ratio W/L for transistors 403, 404 to compensate. Generally, the aspect ratios are selected to match the time constant:

$$\text{Tau} = R_{ON} \cdot C_{Load} \quad (11)$$

between the two signal paths as closely as possible. In particular, the aspect ratio W/L is increased in order to decrease $R_{ON}$ and thereby effectively decrease the time constant Tau. This decrease of the time constant Tau has the advantage of making the converter circuitry significantly scalable as a function of the load present at the converter output.

An averaging effect occurs because the judicious choice of $V_{BIAS}$ allows all four transistors 401–404 to remain on for a period of time, forming a resistive divider, which results in low distortion at the converter output. For example, if signal BIT is high and BITB is low, then output signal $V_{OUTP}$ is at the rail voltage $V_{DDD}$, and $V_{OUTN}$ is at the reference voltage $V_{BIAS}$. As BIT transitions from $V_{DDD}$ to GNDD and BITB from $V_{GND}$ to $V_{DDD}$, all four transistors are on at the crossing voltage (halfway) point for the given choice of reference $V_{BIAS}$. Any charge injection generated by switching of transistors 401–404 does not affect the outputs because the resistive divider formed by the resistance $R_{ON}$ of the transistors causes the outputs $V_{OUTP}$ and $V_{OUTN}$ to respectively transition to the average of $V_{DDD}$ and $V_{BIAS}$ until the full-scale transition is reached.

Figure 5:
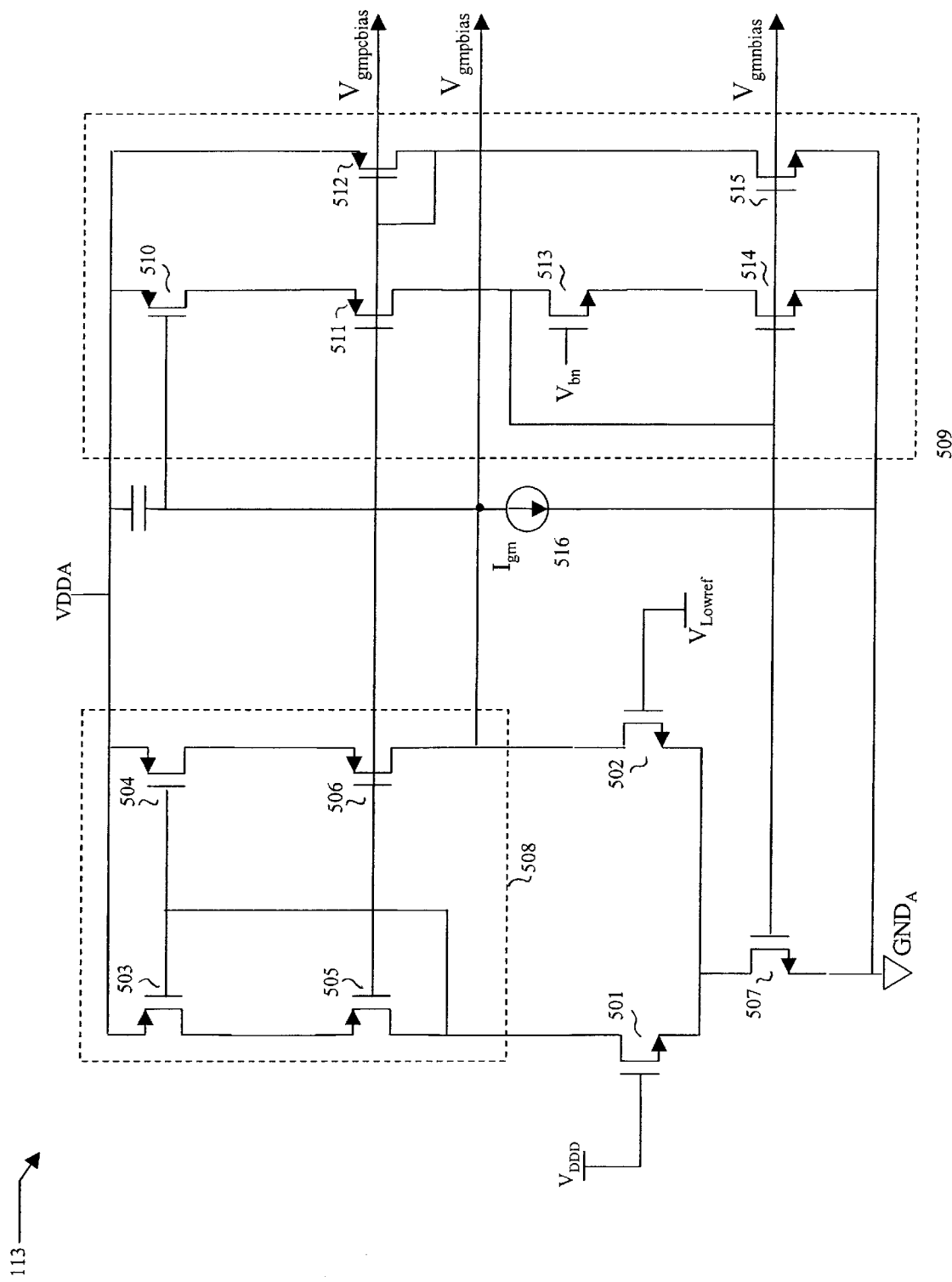
FIG. 5 is an electrical schematic diagram of the exemplary transconductance replica bias current generator shown in FIG. 1B.

FIG. 5 is an electrical schematic diagram of exemplary transconductance replica biasing circuit 113 of FIG. 1B. A differential pair of NMOS transistors 501 and 502 provides the inputs loaded by a cascode load 508 formed by PMOS transistors 503–506. The output (tail) current from the differential pair is controlled by NMOS transistor 507 and an amplifier 509 formed by PMOS transistors, 510–512 and NMOS transistors 513–515. Replica Bias Circuit 113 operates between the analog voltage supply rail $V_{DDA}$ and analog ground $GND_A$. Process, supply, and temperature independent current source 516 provided by a bandgap reference circuit pulls current $I_{gm}$ out of cascode load 508.

Transistor 501 is driven by the digital supply voltage $V_{DDD}$ and transistor 502 by the reference voltage $V_{LOWREF}$.

The $V_{LOWREF}$ is the identical reference voltage utilized to bias up the Bias Generator circuit 101 and subsequently Digital to Differential Analog Converter 103. The value of $V_{LOWREF}$ is provided in Equation (2) above. Using Equation (2), the differential input voltage $V_{IN}$ at the gates of the differential pair transistors 501 and 502 is therefore:

$$V_{IN} = V_{DDD} - V_{LOWREF} = V_{DDD} - (V_{DDD} - m \cdot V_{bg}) = m \cdot V_{bg} \quad (12)$$

which is process, supply, and temperature independent. The voltages $V_{DDD}$ and $V_{LOWREF}$ are such that the digital supply rail $V_{DDD}$ is less than the analog supply rail $V_{DDA}$ and such that the common mode input value:

$$V_{CM} = \frac{1}{2}(V_{DDD} + V_{LOWREF}) = V_{DDD} - m \cdot V_{bg}/2 \quad (13)$$

remains in the common mode input range of the differential pair, tracks the digital supply rail $V_{DDD}$ and is process and temperature independent since the bandgap reference voltage $V_{bg}$ is also process and temperature independent.

Consequently, the output (tail) current $I_{OUT}$ from the differential pair is proportional to the transconductance according to the equation:

$$g_m \cdot V_{in} = I_{out} = > g_m \cdot m \cdot V_{bg} = I_{gm} = > g_m = I_{gm}/(m \cdot V_{bg}) \quad (14)$$

The current $I_{gm}$ and bandgap reference voltage $V_{bg}$ are independent of process, supply and temperature, and therefore, gm is also independent of process, supply and temperature.

Amplifier 509 forces the current through PMOS transistors 503 and 504 to the value $I_{gm}$. Since $V_{DDD} > V_{LOWREF}$, then the differential pair is unbalanced such that NMOS transistor 502 has zero (0) current flowing through it. Since transistors 503 and 504 form a current mirror then:

$$I_{P507} = I_{P505} = I_{P504} = I_{gm}. \quad (15)$$

Figure 6:
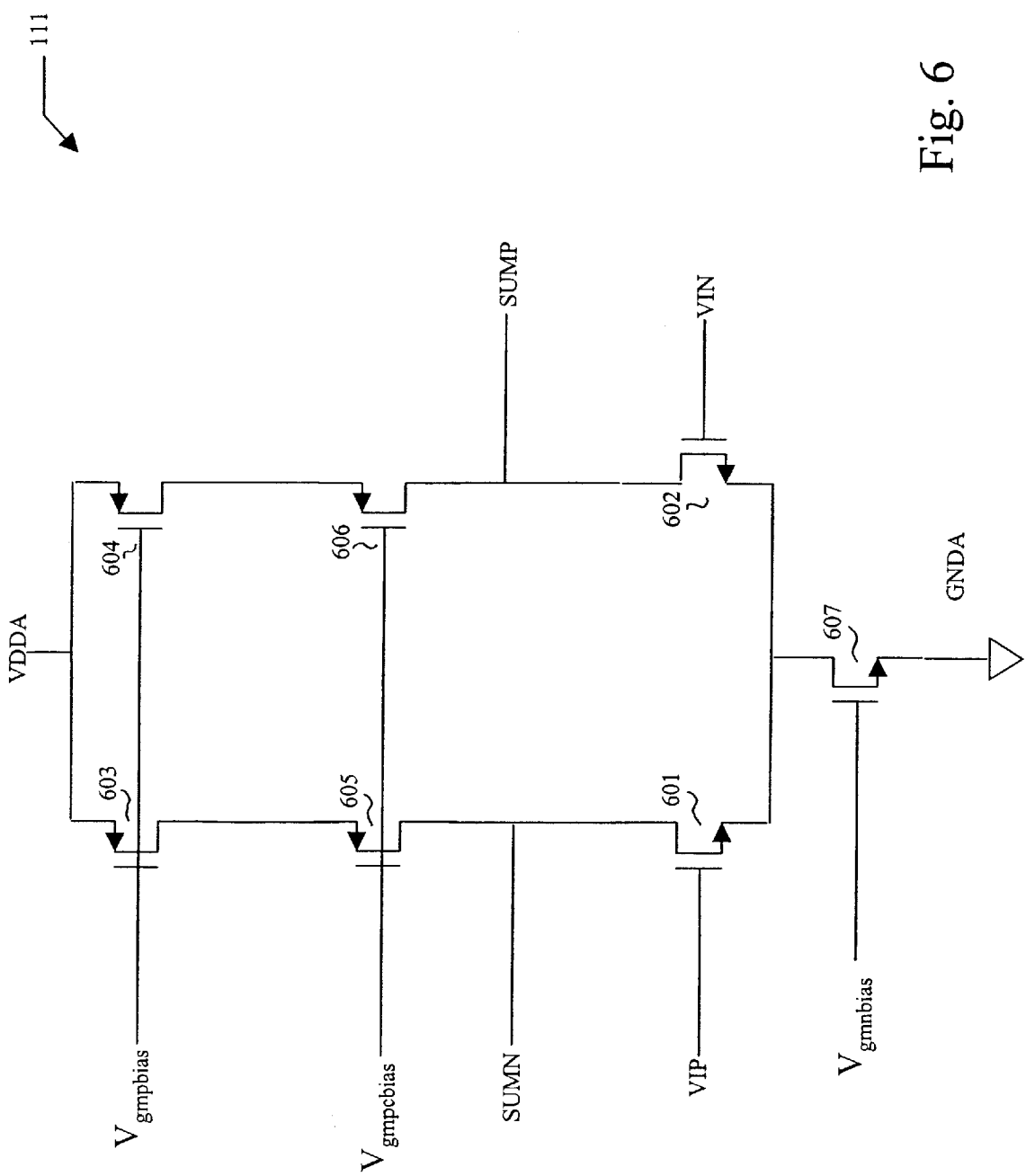
FIG. 6 is an electrical schematic diagram of an exemplary selected one of the current steering cells shown in FIG. 1B.

Bias voltages $V_{gmpcbias}$, $V_{gmpbias}$ and $V_{gmpbias}$, in turn, drive each current steering cell 111 (as shown in FIG. 1B). One exemplary current steering cell 111 is shown in FIG. 6, which is based on a differential pair of NMOS transistors 601 and 602, and PMOS cascode load transistors 603–606. Differential pair transistors 601 and 602 and cascode load transistors 603–606 respectively correspond to differential pair transistors 501 and 502 and the cascode load 508 of Replica Biasing Circuitry 113. The tail current through the differential pair transistors 601 and 602 is controlled by NMOS transistor 607, which corresponds to transistor 507 of Replica Biasing Circuitry 113.

For a by-one (1×) current steering cell producing a unit current step, the sizes (channel width to length ratios) of transistors 601–607 in current steering cell 111 approximate the sizes of corresponding transistors 501–507 in the replica biasing cell 113. The biasing voltages $V_{gmpcbias}$, $V_{gmpbias}$ and $V_{gmpbias}$ ensure that the by-one current steering cell 111 outputs the same temperature, process, and power supply independent current $I_{gm}$ to Current Summer 112 (of FIG. 1B) from differential outputs SUMN and SUMP. By scaling the sizes of transistors 601–607, such as through replication, a by $2^n$ weighted current steering cell 111, producing a current step of $2^n$ times the unit current step, is fabricated in which current steering cell 111 outputs a current of $2^n \cdot I_{gm}$.

Since the Digital to Differential Analog converter 103 and the differential pair Current Steering DAC Cell 111 are biased using the same $V_{LOWREF}$ process and temperature independent voltage reference, a matched converter system is created. In this case, the choice of $V_{LOWREF}$ becomes critical. In order to minimize the distortion in the converter system, the common mode input voltage or crossing point voltage $V_{CM}$ given in Equation (13) is carefully selected. Namely, the multiplicity constant m given in Equation (13) is selected such that the resulting common mode voltage $V_{CM}$ does not cause transistors 401–404 in the Digital to Differential Analog converter 103 and transistors 601 and 602 in the Current Steering DAC Cell 111 differential pair to simultaneously turn off. If the input swing to the Current Steering DAC Cell 111 were allowed to increase to the full digital supply rail, then the crossing voltage point would be $V_{DDD}/2$. In this case, both transistors 601 and 602 would simultaneously turn off causing an unacceptable amount of distortion in the DAC output.

Additionally, the selection of $V_{LOWREF}$ is important in that the input swing to the Current Steering DAC Cell 111 differential pair needs to be large enough to fully unbalance the differential pair forcing current $I_{GM}$ to be output. In other words the multiplicity constant m in the Equation (12) for voltage $V_{IN}$, needs to be selected to allow the Current Steering DAC Cell 111 differential pair to fully steer the current $I_{gm}$ into Summer 112. The proper choice of swing voltage value $V_{IN}$ guarantees that the Current Steering DAC Cell 111 gain error over process, supply and temperature will be minimal. Hence, this invention provides the ability to simultaneously control the crossing point and input swing of the converter in order to minimize both distortion and gain error over process, supply and temperature.

Although the invention has been described with reference to a specific embodiment, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A converter for converting digital data into differential analog signals, comprising:
   a temperature and process independent bias voltage generator for generating a bias voltage; and
   a digital to differential converter for converting a digital word into differential voltages comprising:
     first switching circuitry controlled by the digital word for selectively coupling a first output node to the bias voltage and selectively coupling a second output node to a supply voltage;
     second switching circuitry controlled by a complement of the digital word for selectively coupling the first output node to the supply voltage and the second output node to the bias voltage; and
     wherein the bias voltage is selected such that the first and second switching circuitry substantially simultaneously conduct at a differential cross-over voltage at the first and second output nodes.

2. The converter of claim 1, wherein the first switching circuitry and the second switching circuitry respectively comprise first and second pairs of field effect transistors, the gates of the first pair of transistors controlled by the digital word and the gates of the second pair of transistors controlled by the complement of the digital word.

3. The converter of claim 2, wherein an aspect ratio of the field effect transistors is selected to match a time constant at the first and second output nodes for a selected output load.

4. The converter of claim 2, wherein the field effect transistors comprise PMOS transistors.

5. The converter of claim 1, wherein the bias voltage generator comprises:
   a generator for generating a reference voltage from a digital supply voltage, a current inversely proportional to a first bandgap resistance, and a second bandgap resistance;
   an amplifier having a first input receiving the reference voltage, a second input voltage, and an output generating a control voltage;
   a feedback loop driven by the control voltage for substantially equalizing the input reference voltage and the second input voltage; and
   a replica biased source follower driven by the control voltage for generating the bias voltage.

6. The converter of claim 1, further comprising a digital to complementary digital converter for generating the digital word and the complementary digital word from a received digital word.

7. The converter of claim 6, wherein the digital to complementary digital converter comprises:
   input buffer circuitry for generating first and second complementary intermediate signals;
   a complementary pass transistor gate operating between supply voltage and ground rails and driven by the first and second complementary intermediate signals; and
   output buffer circuitry for generating the digital word and the complement of the digital word from first and second outputs of the complementary pass transistor gate.

8. A digital to differential analog converter cell, comprising:
   a bias voltage generator for generating a temperature and process independent bias voltage from a reference voltage;
   a transconductance replica bias generator for setting a supply, temperature, and process independent transconductance from the reference voltage;
   a low distortion driver for generating first and second differential output signals at corresponding first and second outputs from first and second complementary digital streams, the differential output signals having a crossover voltage between the bias voltage and a supply voltage, wherein the bias voltage is selected such that the first and second outputs of the low distortion drives substantially simultaneously output the first and second differential signals at the crossover voltage; and
   a current steering cell for selectively generating a current proportional to the bias current input to the transconductance replica bias generator in response to the differential output signals from the low distortion driver with minimal gain variation over process, supply, and temperature, the current steering cell biased such that the first and second outputs of the current steering cell are substantially simultaneously outputting first and second differential outputs of the converter cell.

9. The digital to differential analog converter cell of claim 8 wherein the low distortion driver comprises:
   a first transistor for selectively pulling the first output node to the supply voltage in response to the first digital stream;

a second transistor for selectively pulling the second output node to the bias voltage in response to the first digital stream;

a third transistor for selectively pulling the first output node to the bias voltage in response to the second digital stream;

a fourth transistor for selectively pulling the second output node to the supply voltage in response to the second digital stream; and wherein the first, second, third, and fourth transistors substantially simultaneously turn-on at the crossover voltage.

10. The digital to differential converter cell of claim 9 wherein:

the first and third transistors comprise PMOS transistors coupled in series at the first output node, a gate of the first transistor controlled by the first digital stream, and a gate of the third transistor controlled by the second digital stream; and the second and fourth transistors comprise PMOS transistors coupled in series at the second output node, a gate of the second transistor controlled by the first digital stream, and a gate of the fourth transistor controlled by the second digital stream.

11. The digital to differential converter cell of claim 9, wherein an aspect of ratio of each of the transistors is selected to match a time constant through the first and second output nodes for a selected output capacitive load.

12. The digital to differential converter cell of claim 8, wherein the reference voltage generator comprises:

a current source generating a current proportional to a bandgap voltage and a bandgap resistance;

a resistor coupled to the voltage supply and having a resistance of a selected multiple of the bandgap resistance for setting the reference voltage at a node between the current source and the resistor;

a high gain amplifier having inputs receiving the reference voltage and a feedback voltage and an output outputting a control voltage;

a feedback loop for generating a feedback voltage in response to the control voltage, the feedback loop equalizing the feedback and reference voltages at the inputs to the amplifier; and a replica biased source follower for outputting the bias voltage to the low distortion driver.

13. The digital to differential analog converter cell of claim 8, wherein the transconductance replica bias generator comprises:

first and second differential pair transistors, an input to the first transistor set to a supply voltage and an input to the second transistor set to the reference voltage;

a third load transistor coupled in series with the first transistor and a fourth load transistor coupled in series with the second transistor, the third and fourth transistors forming a current mirror;

a supply, temperature, and process independent current source coupled to an output node between the second and fourth transistors for sinking a selected bias current; and a feedback loop for controlling a current through the first and third transistors, the current through the third transistor mirrored through the fourth transistor to approximate the bias current.

14. The digital to differential converter cell of claim 8, wherein the current steering cell comprises:

first and second differential pair transistors receiving the differential signals from the low distortion driver;

third and fourth load transistors coupled in series with the first and second pair of differential pair transistors; and a tail current control transistor in series with the first and second differential pair transistors, the tail current control transistor and the third and fourth transistors biased to replicate by a selected multiple the supply, temperature, and process independent bias current set by the transconductance replica bias generator.

15. A digital to analog converter, comprising:

a bias generation circuitry for setting a temperature and process independent bias voltage and a supply, temperature and process independent transconductance;

digital to differential converter for converting a bit of a received digital codeword into a pair of differential signals comprising:

a first pair of switches controlled by the bit for selectively driving a first of the pair of differential signals from the bias voltage and a second of the pair of differential signals from a supply voltage; and a second pair of switches controlled by a complement of the bit for selectively driving the first of the pair of differential signals from the supply voltage and the second of the pair of differential signals from the bias voltage, the first and second pairs of switches substantially simultaneously conducting at a crossover voltage of the pair of differential signals; and circuitry for generating an analog output signal from said pair of differential signals by replicating the transconductance by a selected multiple.

16. The digital to analog converter of claim 15, wherein said circuitry for generating comprises a current steering cell of a selected weight corresponding to the selected multiple of the bias current.

17. The digital to analog converter of claim 15, wherein the bit comprises a selected one of a plurality of binary bits forming at least a portion of the received digital codeword.

18. The digital to analog converter of claim 15, wherein the bit comprises a selected one of a plurality of thermometer encoded bits forming at least a portion of the received codeword.

* * * * *